(12) United States Patent
Drechsel et al.

(10) Patent No.: US 10,147,601 B2
(45) Date of Patent: Dec. 4, 2018

(54) METHOD FOR PRODUCING A LAYER STRUCTURE AS A BUFFER LAYER OF A SEMICONDUCTOR COMPONENT AND LAYER STRUCTURE AS A BUFFER LAYER OF A SEMICONDUCTOR COMPONENT

(71) Applicant: OSRAM Opto Semiconductors GmbH, Regensburg (DE)

(72) Inventors: Philipp Drechsel, Regensburg (DE); Werner Bergbauer, Windberg (DE); Juergen Off, Regensburg (DE); Peter Stauss, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 50 days.

(21) Appl. No.: 15/304,488

(22) PCT Filed: Apr. 13, 2015

(86) PCT No.: PCT/EP2015/057972
§ 371 (c)(1),
(2) Date: Oct. 14, 2016

(87) PCT Pub. No.: WO2015/158658
PCT Pub. Date: Oct. 22, 2015

(65) Prior Publication Data
US 2017/0040165 A1    Feb. 9, 2017

(30) Foreign Application Priority Data
Apr. 14, 2014  (DE) .................. 10 2014 105 303

(51) Int. Cl.
*H01L 31/0256*    (2006.01)
*H01L 21/02*    (2006.01)
(Continued)

(52) U.S. Cl.
CPC .... *H01L 21/02458* (2013.01); *H01L 21/0254* (2013.01); *H01L 21/0262* (2013.01);
(Continued)

(58) Field of Classification Search
CPC ......... H01L 21/02107; H01L 21/02381; H01L 21/02458; H01L 21/02488;
(Continued)

(56) References Cited

U.S. PATENT DOCUMENTS 6,592,661 B1 *  7/2003  Thakur ................... C30B 31/12
117/103
6,989,287 B2   1/2006  Fujikura et al.
(Continued)

FOREIGN PATENT DOCUMENTS

DE        10034263 A1       1/2002
DE    102006008929 A1       8/2007
(Continued)

OTHER PUBLICATIONS

Mo, C. et al., "Growth and characterization of InGaN blue LED structure on Si(1 1 1) by MOCVD", Journal of Crystal Growth, 285, Aug. 2005, pp. 312-317.
(Continued)

*Primary Examiner* — Robert G Bachner
(74) *Attorney, Agent, or Firm* — McDermott Will & Emery LLP

(57) ABSTRACT

What is specified is a method for producing a layer structure (10) as a buffer layer of a semiconductor component, said method comprising the following steps: a) provision of a carrier (1), which has a silicon surface (1a), b) deposition of a first layer sequence (2), which comprises a seeding layer (21) containing aluminum and nitrogen, on the silicon surface (1a) of the carrier (1) along a stacking direction (H) running perpendicular to a main plane of extent of the carrier
(Continued)

(1), c) three-dimensional growth of a 3D-GaN layer (3), which is formed with gallium nitride, on a top surface (2a) of the first layer sequence (2) which is remote from the silicon surface (1a), d) two-dimensional growth of a 2D-GaN layer (4), which is formed with gallium nitride, on the outer surfaces (3a) of the 3D-GaN layer (3) which are remote from the silicon surface (1a).

19 Claims, 3 Drawing Sheets

(51) Int. Cl.
*H01L 33/00* (2010.01)
*H01L 33/12* (2010.01)
*H01L 33/32* (2010.01)

(52) U.S. Cl.
CPC .. *H01L 21/02107* (2013.01); *H01L 21/02381* (2013.01); *H01L 21/02505* (2013.01); *H01L 21/02513* (2013.01); *H01L 21/02647* (2013.01); *H01L 33/007* (2013.01); *H01L 33/12* (2013.01); *H01L 33/32* (2013.01); *H01L 21/02488* (2013.01)

(58) Field of Classification Search
CPC ......... H01L 21/02505; H01L 21/02513; H01L 21/0254; H01L 21/0262; H01L 21/02647; H01L 33/007; H01L 33/12; H01L 33/32; H01L 2924/00; H01L 29/0665; H01L 29/0673; H01L 29/068; H01L 33/20; H01L 2924/1305; H01L 2924/13091; H01L 29/78696; H01L 51/0048; H01L 51/0545; H01L 2924/14; H01L 2924/12032; H01L 2924/12
See application file for complete search history.

(56) References Cited

U.S. PATENT DOCUMENTS

| | | |
|---|---|---|
| 2002/0170489 A1 | 11/2002 | Biwa et al. |
| 2007/0141823 A1 | 6/2007 | Preble et al. |
| 2009/0050915 A1 | 2/2009 | Yamamoto |
| 2013/0001748 A1 | 1/2013 | Faurie et al. |
| 2013/0270575 A1* | 10/2013 | Humphreys ...... H01L 21/02381 257/76 |
| 2014/0302665 A1 | 10/2014 | Stauss et al. |

FOREIGN PATENT DOCUMENTS

| | | |
|---|---|---|
| DE | 102009047881 A1 | 4/2011 |
| DE | 102010035489 A1 | 3/2012 |
| EP | 1875523 B1 | 9/2010 |
| JP | 2002093720 A | 3/2002 |
| JP | 2005019872 A | 1/2005 |
| JP | 2005064336 A | 3/2005 |
| JP | 2014527707 A | 10/2014 |
| WO | 2002029873 A1 | 4/2002 |
| WO | 2011039181 A1 | 4/2011 |
| WO | 2013001014 A1 | 1/2013 |
| WO | 2013045190 A1 | 4/2013 |
| WO | 2013045355 A1 | 4/2013 |
| WO | 2014048991 A2 | 4/2014 |
| WO | 2014053831 A1 | 4/2014 |
| WO | 2014118162 A1 | 8/2014 |

OTHER PUBLICATIONS

Gibart, P. et al., "Epitaxial Lateral Overgrowth of GaN", Nitride Semiconductors: Handbook on Materials and Devices, 2003, pp. 45-106.

* cited by examiner

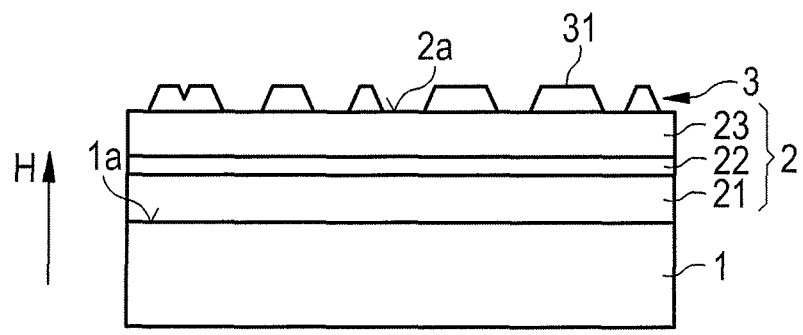
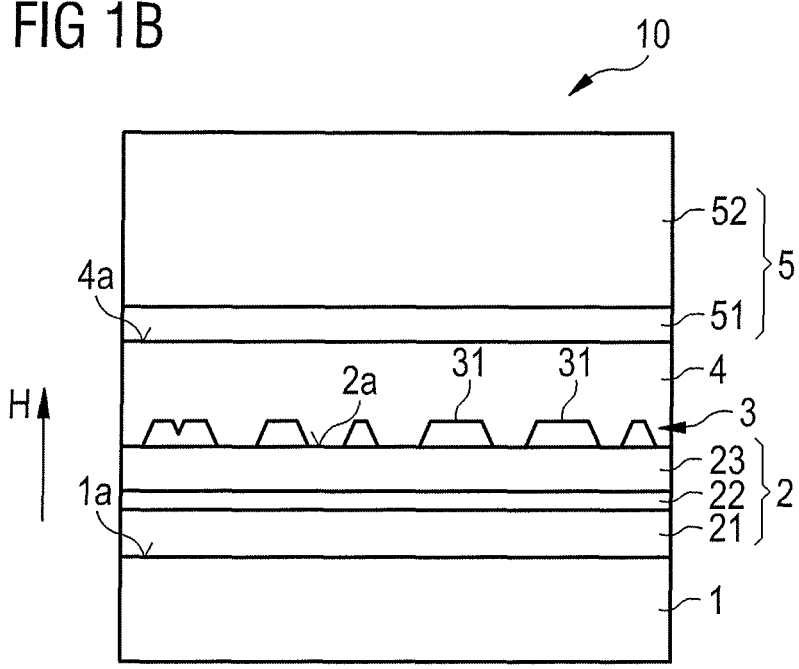

METHOD FOR PRODUCING A LAYER STRUCTURE AS A BUFFER LAYER OF A SEMICONDUCTOR COMPONENT AND LAYER STRUCTURE AS A BUFFER LAYER OF A SEMICONDUCTOR COMPONENT

The documents DE 10 2006 008 929 A1, DE 10 2009 047 881 A1, DE 10 2010 035 489 A1 and WO 2011/039181 A1 each describe a layer structure as a buffer layer of a semiconductor component and/or a method for producing such a layer structure.

One object to be achieved consists in providing a method for producing a layer structure as a buffer layer of a semiconductor component having a crystalline quality that is as high as possible. Another object to be achieved consists in providing a layer structure having a crystalline quality that is as high as possible for a semiconductor component.

Here and below, a layer, such as e.g. the buffer layer, can mean in particular a layer stack.

A layer structure having high crystalline quality is distinguished in particular by the fact that few crystallographic defects, such as e.g. dislocations, voids and/or faults, can be found in the crystal lattice at least in some regions of the layer structure, for example at a growth surface of the layer structure bordering air and/or bordering other layers.

A method is provided for producing a layer structure as a buffer layer of a semiconductor component. The semiconductor component that can be grown on to the layer structure can be, for example, an optoelectronic semiconductor component or an electronic semiconductor component. The semiconductor component comprises in particular gallium and/or nitrogen. The semiconductor component is, for example, a photodiode, a light-emitting diode, a laser diode, a transistor and/or an integrated circuit. In general, the semiconductor component can be a component that comprises, for example, gallium and/or nitrogen. The semiconductor component is preferably grown on to the layer structure.

According to at least one embodiment of the method, a carrier is first prepared. The carrier can be, for example, a temporary carrier, which is removed again in a subsequent process step, or a carrier that remains on the layer structure after production. The carrier can in particular be a substrate.

The carrier has a main extension plane in which it extends in lateral directions. Perpendicular to the main extension plane, in the vertical direction, the carrier has a thickness. The thickness of the carrier is small compared with the maximum extent of the carrier in a lateral direction. A main plane of the carrier forms a silicon surface of the carrier. A stacking direction of the layer structure runs perpendicular to the main extension plane.

According to at least one embodiment of the method, the carrier comprises the silicon surface. In this case, it is possible for the carrier to be formed almost completely from silicon. "Almost completely" here and below can mean that at least 90%, preferably at least 95%, of the material of the carrier is silicon. The carrier can then in particular consist of silicon. Alternatively, it is possible for the carrier to be made up of multiple layers, in which case one of the layers forms an external layer of the carrier. This external layer can be formed with silicon. In particular, this external layer can be formed almost completely from silicon or can consist of silicon. The outer surface of the external layer then forms the silicon surface of the carrier.

According to at least one embodiment of the method, a first layer sequence is deposited on to the silicon surface of the carrier. The first layer sequence comprises a seeding layer that contains aluminum and nitrogen. In particular, the material of the first layer sequence has a natural lattice constant that differs from the natural lattice constant of the material of the silicon surface. In particular, the natural lattice constant of the material of the silicon surface can be greater than the natural lattice constant of the material of the first layer sequence. The "natural lattice constant" of a material here can be the lattice constant that occurs in the material used when crystallization takes place under ideal conditions, for example in the absence of stresses.

The seeding layer can also contain gallium. The seeding layer can therefore be formed with $Al_nGa_mN$, where preferably $0.95 \leq n \leq 1$ and $0 \leq m \leq 0.05$. In other words, based on the aluminum concentration n, a low gallium concentration m is selected. For example, 5% of the aluminum atoms can be replaced with gallium atoms in the seeding layer. In addition, the seeding layer can contain oxygen, in which case the oxygen content of the seeding layer can preferably be controlled by a targeted addition of oxygen. The seeding layer particularly acts as a protective layer in a production process, since an immediate growth of layers containing a large quantity of gallium on the silicon surface under the process conditions prevailing in the reactor chamber could lead to a chemical reaction on the silicon surface and to the destruction thereof.

According to at least one embodiment of the method, a 3D GaN layer is grown on to a top surface of the first layer sequence, the top surface facing away from the silicon surface. The 3D GaN layer can be formed with gallium nitride or can consist of gallium nitride. In particular, the growth of the 3D GaN layer takes place three-dimensionally. In other words, the growth conditions are set such that the growth can be described according to the so-called Volmer-Weber growth model or the Stranski-Krastanov growth model.

The growth rate along the stacking direction can be higher compared with the growth rate along the lateral directions. The three-dimensional growth results in incomplete coverage of the top surface of the first layer sequence. In other words, the top surface can at the same time be covered in places and freely accessible in other places. In particular, this results in the 3D GaN layer having a plurality of multi-layer islands extending along a stacking direction. The multi-layer islands are not connected to one another laterally, at least in places. In other words, it is possible for empty spaces to be present between at least two of the islands. Furthermore, it is possible for empty spaces to be present between a majority of the islands. "Multi-layer" here and below means that the islands contain multiple monolayers grown one on top of another. A monolayer here and below is to be understood as a continuous layer of atoms or molecules, the height of the layer being only one atom or molecule. In particular, no similar atoms or molecules lie one on top of another in a monolayer. It is possible in this case for each island to have multiple monolayers grown one on top of another, in which case the monolayers of the respective islands can, at least at times, be unconnected to monolayers of adjacent islands.

In the case of three-dimensional growth, therefore, rather than growing continuous two-dimensional monolayers upon monolayers, individual islands are initially formed. In the event that three-dimensional growth lasts for a prolonged period, these islands could coalesce laterally at the monolayers that grew at an earlier stage, i.e. the monolayers closer to the carrier. In the case of a shorter period of three-dimensional growth as described here, the islands of the 3D GaN layer are not connected with one another laterally. This means that the three-dimensional growth is ended before the islands could coalesce laterally, at least in some areas. The three-dimensional growth can be ended e.g. by changing the growth conditions to the growth conditions of the layer grown after the 3D GaN layer.

In particular, it is possible in the case of three-dimensional growth that the crystalline structure of the 3D GaN layer does not have its natural lattice constant but adopts the natural lattice constant of the material of the top surface of the first layer sequence. "Adopting the natural lattice constant of a material" here and below can mean that monolayers of the 3D GaN layer that grew at an earlier stage, i.e. the monolayers situated closer to the top surface of the first layer sequence in the stacking direction, have a lattice constant along at least one spatial direction, the value of which lies between the natural lattice constant of the material of the 3D GaN layer along said spatial direction and the natural lattice constant of the material of the top surface of the first layer sequence along said spatial direction. The "said spatial direction" is preferably a spatial direction that runs parallel to the main extension plane within the limits of production tolerances. The deviation from the inherent natural lattice constant can be adjusted by the growth conditions here. Monolayers of the 3D GaN layer grown at a later stage can then have at least one lattice constant that corresponds to the natural lattice constant of the material of the 3D GaN layer within the limits of production tolerances.

According to at least one embodiment of the method, a 2D GaN layer is grown two-dimensionally on the outer surfaces of the 3D GaN layer, the outer surfaces facing away from the silicon surface. In other words, the 3D GaN layer is coalesced by the growth of the 2D GaN layer to obtain a GaN layer formed over the entire surface, which is made of the 3D GaN layer and the 2D GaN layer. By changing the growth conditions to two-dimensional growth, therefore, as a result of the coalescence of the 3D GaN layer, a smooth 2D GaN layer is created. The 2D GaN layer is formed with gallium nitride, for example. Two-dimensional growth here and below is to be understood to mean that the growth rate along the lateral directions can be higher than or exactly as high as the growth rate along the stacking direction. In other words, the growth conditions are adjusted so that the growth can be described according to the so-called Frank-van der Merwe growth model.

During two-dimensional growth, the empty spaces between the multi-layer islands of the 3D GaN layer are preferably filled in first, while the covering of the islands initially takes place only very weakly, i.e. at a low growth rate. After the empty spaces between the multi-layer islands have been filled in, an even covering occurs on the surface of the 3D GaN layer and the monolayers of the 2D GaN layer that have already grown, so that, after the two-dimensional growth of the 2D GaN layer, the multi-layer islands of the 3D GaN layer are no longer freely accessible from the outside and are covered on all the outer surfaces by the 2D GaN layer and are in direct contact therewith.

According to at least one embodiment of the method for producing a layer structure as a buffer layer of a semiconductor component, the method comprises the following steps:
a) providing a carrier, which has a silicon surface,
b) deposition of a first layer sequence, which comprises a seeding layer containing aluminum, oxygen and nitrogen, on the silicon surface of the carrier, along a stacking direction running perpendicular to a main extension plane of the carrier,
c) three-dimensional growth of a 3D GaN layer, which is formed with gallium nitride, on a top surface of the first layer sequence, the top surface facing away from the silicon surface,
d) two-dimensional growth of a 2D GaN layer, which is formed with gallium nitride, on the outer surfaces of the 3D GaN layer, the outer surfaces facing away from the silicon surface.

The process steps are preferably carried out in the stated sequence.

With the method described here, one of the ideas being pursued is to allow, by means of a three-dimensional growth of the 3D GaN layer, a subsequent two-dimensional growth of the 2D GaN layer with a reduced defect density and/or a reduced dislocation density in the crystalline structure of the 2D GaN layer compared with the layers of the first layer sequence. The layer structure can then buffer the above-mentioned faults in the crystalline structure and/or material properties of the first layer sequence and/or of the carrier and thus act as a buffer layer. The selection of the three-dimensional growth conditions for the creation of the islands here replaces a growth of gallium nitride-containing layers after a mask layer.

As a result, a mask layer, which is formed for example with silicon nitride, is not required in the method described here for producing a layer structure. It has been found that such a mask layer with silicon and/or silicon nitride causes faults that are difficult to control in an n-sided roughening of a semiconductor component grown on the layer structure, where said roughening has been created through a mask layer. Furthermore, the silicon contained in the mask layer can diffuse into adjacent gallium nitride-containing layers and/or a carry-over of the silicon material still present in the reactor can occur during the production process. This would lead to an undesirable doping of said gallium nitride-containing layers. The gallium nitride-containing layers could in this case become electrically conductive. Such a doping of the layer structure, particularly of the first layer sequence, with silicon, i.e. a doping of the buffer layer for subsequent active or functional regions of a semiconductor component, can lead to malfunctions, particularly in electronic components such as transistors.

The layer structure, in particular the first layer sequence, the 3D GaN layer and the 2D GaN layer, can therefore—with the exception of the silicon surface of the carrier be free from silicon. "Free from silicon" here and below can mean that silicon atoms are not intentionally introduced into the layer structure, but are present in the layer structure only as an impurity within the limits of production tolerances.

Furthermore, the method described here makes it possible to reduce crystallographic defects in the crystalline structure of a growth surface of the layer structure provided for the growth of a semiconductor component compared with a growth surface of an otherwise structurally identical layer structure having silicon nitride as a mask layer. The 3D GaN layer here serves in particular to prevent crystallographic defects, such as e.g. faults and dislocations, in particular dislocations containing an edge dislocation fraction, which are present in the material of the first layer sequence, from being passed on to the 2D GaN layer. The 2D GaN layer can thus in particular have fewer dislocations than the 3D GaN layer. Such a layer structure permits in particular the growth of functional layers of a semiconductor component, wherein—owing to the reduction in crystallographic defects in the layer structure functioning as a buffer layer—the material of the functional layers of the semiconductor component can exhibit a high crystalline quality.

In addition, a layer structure can be provided which, in the cooled state, has low curvature and in particular low, or preferably no, tensile stress. The layer structure preferably exhibits a convex curvature, no curvature or a very slight concave curvature. The terms "convex" and "concave" here and below are to be viewed in relation to the main extension plane of the carrier. A convex curvature is present if the layer structure exhibits a positive curvature in the stacking direction. Accordingly, in the case of concave curvature there is a negative curvature in the stacking direction. In the case of concave curvature, the layer structure may be under tensile stress and in the case of convex curvature a compressive stress may be present.

Tensile stress is undesirable in a layer structure as described here, since cracks can form in the event of such a tensile stress in the layer stack. These cracks can destroy the electrical and optoelectronic layers of a grown semiconductor component. This would result in an increased risk of failure of a semiconductor component.

According to at least one embodiment of the method, the 3D GaN layer grown in step c) has a plurality of multi-layer islands, which extend along the stacking direction. In this case, in particular an incomplete coverage of the top surface of the first layer sequence with the plurality of multi-layer islands may be obtained. An incomplete coverage here and below means that the underlying layer, i.e. the layer arranged before the incompletely covered layer in the stacking direction, is free from said layer in places. The multi-layer islands can have different sizes here.

Lateral surfaces of the multi-layer islands can in some cases run obliquely to the top surface of the first layer sequence. For example, the multi-layer islands can have the shape of a stylized trapezium in a cross-sectional view. In other words, after the growth of the 3D GaN layer has ended, monolayers of the multi-layer islands located closer to the top surface of the first layer sequence in the stacking direction can extend further in lateral directions than more remote monolayers. The stylized trapezium shape makes it possible in particular to change the direction of growth of dislocations in the crystal lattice. For example, a dislocation extending along the stacking direction in the first layer sequence can change its direction of growth within one of the islands of the 3D GaN layer and then run transverse to the stacking direction.

According to at least one embodiment of the method, in step d) the plurality of multi-layer islands coalesce by means of the 2D GaN layer. This means that in step d), the 2D GaN layer covers the plurality of multi-layer islands and the top surface of the first layer sequence. In particular, the 2D GaN layer borders the lateral surfaces of the multi-layer islands. Since the 2D GaN layer has a high lateral growth rate, it is possible that the 2D GaN layer initially grows more rapidly within the spaces between the islands of the 3D GaN layer (so-called coalescence) and then grows layer by layer, for example monolayer by monolayer.

As a result of a filter effect of the 3D GaN layer and the lateral, i.e. two-dimensional, growth of the 2D GaN layer there is a significant reduction in the defect or dislocation density. Since at some points the dislocations run transverse to the stacking direction in the area of the islands, i.e. along one of the main directions of extent of the carrier, it is possible for dislocations to coalesce in the transitional area between the 3D GaN layer and the 2D GaN layer. This leads to an annihilation of the dislocations. In particular, the annihilation of the dislocations and the associated reduction in dislocation density in the region of the 3D GaN layer can be measured using a transmission electron microscope (TEM). The 3D GaN layer can therefore also be detected on the finished object.

According to at least one embodiment of the method, during the three-dimensional growth of the 3D GaN layer in step c) compared with the two-dimensional growth of the 2D GaN layer in step d) at least one of three growth conditions is changed as follows:
reduction of the reactor temperature,
increase of the reactor pressure and/or
reduction of the V/III ratio.

The V/III ratio is set here by means of the ratio of the group V atoms, i.e. the nitrogen atoms, to the elements of the group III atoms, i.e. for example the aluminum and gallium atoms, in the reactor chamber.

The growth of the layers of the layer structure and in particular the 3D GaN layer can take place for example by means of metal-organic chemical vapor deposition (MOCVD). The growth of the layers in this case takes place in a reactor chamber at an adjustable reactor temperature with one or more precursors, which in conjunction with other gases create an adjustable reactor pressure in the reactor chamber. As precursors it is possible to use e.g. ammonia, triethylgallium, trimethylgallium and/or trimethylaluminium.

During the growth of the 3D GaN layer, the reactor temperature is preferably set at least 30° C. below the reactor temperature for the growth of the 2D GaN layer. For example, the reactor temperature is 1020° C. during three-dimensional growth and 1060° C. during two-dimensional growth. In particular, it is possible that the reactor temperature is lower during three-dimensional growth than during two-dimensional growth. For example, the reactor temperature during three-dimensional growth is more than 980° C., preferably more than 1000° C. and more preferably more than 1020° C. Furthermore, the reactor temperature during two-dimensional growth can be more than 1020° C., preferably more than 1040° C. and more preferably more than 1060° C.

The reactor pressure during three-dimensional growth can be at least a factor of 2, preferably a factor of 4, above the reactor pressure during two-dimensional growth. For example, the reactor pressure during three-dimensional growth is 600 mbar, while the reactor pressure during two-dimensional growth can be in a range of 100 mbar to 200 mbar. In particular, deposition under high pressure can result in the formation of the three-dimensional morphology of the 3D GaN layer.

The V/III ratio during three-dimensional growth can be e.g. no higher than 500. This means that the ratio of group V atoms (here: nitrogen) to group III atoms (here: gallium) provided in the reactor chamber is no more than 500. In comparison, the V/III ratio during two-dimensional growth can be in the range of 1000 and more.

The change in the growth conditions, as stated above, leads for example to the 3-dimensional growth of the 3D GaN layer in step c). In particular, the 3D GaN layer can exhibit high roughness compared with the two-dimensionally grown 2D GaN layer in step d) as a result of the changed growth conditions and/or of the three-dimensional growth. The reduction of the V/III ratio during the three-dimensional growth in step c) can lead to an increased proportion of carbon impurities in the 3D GaN layer. This means that the selected growth conditions may be detectable on the finished object. The layer structure can therefore have a higher carbon content in the region of the 3D GaN layer than in the region of the 2D GaN layer.

According to at least one embodiment of the method, the deposition of the first layer sequence in step b) includes the following steps:
growth of the seeding layer onto the silicon surface of the carrier,
growth of a buffer layer comprising aluminum, oxygen and nitrogen on a side of the seeding layer facing away from the silicon surface.

The above steps are preferably performed in the above order.

The first layer sequence can therefore comprise a buffer layer as well as the seeding layer. However, other layers are also possible, which can contain aluminum, oxygen, gallium and/or nitrogen. The buffer layer in this case can be formed from the same material as the seeding layer.

According to at least one embodiment of the method, a gradient layer which is formed with $Al_xGa_yN$ is grown on a side of the buffer layer facing away from the silicon surface. The gradient layer can also be part of the first layer sequence. In this case, the concentration fraction of the aluminum atoms x decreases along the stacking direction and the concentration fraction of the gallium atoms y increases along the stacking direction. The "concentration fraction" or "fraction" here and below can be the mole fraction or amount-of-substance fraction.

In particular, it is possible to vary the aluminum fraction of the gradient layer along the stacking direction. In particular, the fraction of aluminum atoms can be reduced along the stacking direction. This procedure leads in particular to an increasing natural lattice constant of the gradient layer with increasing distance from the silicon surface along at least one spatial direction running parallel to the main extension plane. The idea being pursued here is to change the natural lattice constant of the material of the gradient layer continuously in order to allow better adaptation to the natural lattice constants of the 3D GaN layer and the 2D GaN layer compared with a first layer sequence which does not comprise a gradient layer. In addition, the number of defects in layers further away from the carrier in the stacking direction can be reduced by the first layer sequence.

For example, the aluminum concentration x can be 95%, based on the total concentration of aluminum and gallium in the monolayers that were grown at an earlier stage and are therefore situated closer to the silicon surface. In the monolayers that are grown at a later stage, the aluminum concentration can be 60%. However, it is also possible that the aluminum fraction is reduced to up to 0% based on the total concentration of aluminum and gallium in monolayers that are grown at a later stage.

According to at least one embodiment of the method, following the growth of the 2D GaN layer in step d), a second layer sequence containing aluminum, gallium and nitrogen is grown on a side of the 2D GaN layer facing away from the silicon surface. A top surface of the second layer sequence, the top surface facing away from the silicon surface, can act as a growth surface for functional layers of a semiconductor component. The second layer sequence comprises a relaxed layer and a pseudomorphic layer, the growth of the relaxed layer taking place before the growth of the pseudomorphic layer.

A relaxed layer here and below means a layer having regions of which the lattice constant corresponds, within the limits of production tolerances, to the natural lattice constant of the material of which the relaxed layer consists. In the other regions, the relaxed layer can have a lattice constant which is between the natural lattice constant of the material of the relaxed layer and the natural lattice constant of the material of the pseudomorphic layer. To achieve a partially relaxed growth of this type, the growth conditions are changed e.g. as follows during the growth of the relaxed layer. For example, during the growth of the relaxed layer a low reactor temperature (so-called cold growth) and/or a high aluminum fraction can be set in the reactor chamber. In addition, the relaxed layer is preferably grown in such a way that the thickness of the relaxed layer along the stacking direction exceeds a critical layer thickness. Above this critical layer thickness, a layer can be relaxed.

The pseudomorphic layer can exhibit an at least partially pseudomorphic crystalline structure, i.e. the pseudomorphic layer, at least in part, does not exhibit its natural lattice constant and/or crystalline structure. Preferably, the pseudomorphic layer is under compressive stress during growth. The relaxed layer can have a higher aluminum fraction than the pseudomorphic layer. Preferably, the relaxed layer is grown before the pseudomorphic layer in the stacking direction and the layers border one another directly.

During pseudomorphic growth, the growth conditions are set such that the pseudomorphic layer adopts the natural lattice constant of the material of the previously grown relaxed layer. Since the natural lattice constant of a layer with $Al_xGa_yN$ increases with decreasing aluminum fraction x, the natural lattice constant of the relaxed layer is lower than the natural lattice constant of the pseudomorphic layer. Since the pseudomorphic layer adopts the natural lattice constant of the relaxed layer, a compressive stress of the pseudomorphic layer can preferably occur. In other words, the not yet cooled layer structure exhibits a convex curvature no later than after the growth of the second layer sequence. Pseudomorphic growth conditions can be created for example by using a small amount of dopant, such as silicon, or generally with growth conditions like those of the two-dimensional growth in step d) of the method. A high V/III ratio can also be helpful in establishing pseudomorphic growth conditions.

According to at least one embodiment of the method, the multi-layer islands of the 3D GaN layer and the 2D GaN layer are each under compressive stress before the layer structure is cooled. This means that after the growth of the GaN layer which is formed from the 3D GaN layer and the 2D GaN layer, a compressive stress is already present in the layers that have grown. The compressive stress can have its origin for example in the growth of the GaN layer on the aluminum nitride-containing first layer sequence. Because of the different natural lattice constants of the GaN layer and the first layer sequence, a compressive stress of the GaN layer occurs. In this case there is a considerable difference over a comparable layer structure comprising a mask layer. In the case of a mask layer, the natural lattice constant of the GaN layer is barely influenced by the first layer sequence. In the absence of a mask layer, there is a greater influence on the natural lattice constant, resulting in an additional compressive stress before cooling. In this way, tensile stress during cooling can be avoided.

According to at least one embodiment of the method, the layer structure is cooled at the end of the method, the curvature of the layer structure being convex before cooling. The absolute amount of the curvature—with a height of the carrier in the stacking direction of e.g. 1.2 mm and a height of the layer stack in the stacking direction of e.g. 5 μm—can be for example at least 75 $km^{-1}$. Owing to the compressive stress of the previous layers, therefore, a convex curvature of at least 75 $km^{-1}$ forms in the layer structure. During cooling, this convex curvature is changed to a concave curvature and/or to a less convex curvature. As a result, the compressive stress of the layer structure is relaxed. In particular, the different coefficients of thermal expansion of the carrier and the different gallium nitride-containing layers lead to a relaxation of the curvature, i.e. the compressive stress, of the layer structure here. The material of the carrier can have a lower coefficient of thermal expansion than the material of the layers grown on the carrier here, which can result in undesirable tensile stress during cooling.

According to at least one embodiment of the method, the introduction of silicon into the layer structure is specifically avoided, with the exception of the silicon surface of the carrier. In particular, the layer structure can be free from a silicon-containing mask layer. Among other things, the incorporation of silicon as a dopant into the gallium nitride layers should be avoided. This makes it possible to avoid leakage through the layer structure, and thus an undesirable transverse conductivity of the layer structure.

Furthermore, a layer structure as a buffer layer of a semiconductor component is provided. The layer structure can preferably be produced by means of one of the methods described here, i.e. all features disclosed for the method are also disclosed for the layer structure and vice versa.

According to at least one embodiment of the layer structure, this contains the carrier with the silicon surface and a layer stack, which is arranged on the silicon surface of the carrier in the stacking direction. The layer stack comprises the first layer sequence with the seeding layer, which contains aluminum and nitrogen. In addition, the layer stack comprises a GaN layer, which is formed with gallium nitride or consists thereof. The density of dislocations in the crystalline structure in the layer stack, in particular edge dislocations, screw dislocations and/or dislocations containing an edge dislocation fraction, decreases along the stacking direction. It is also possible for the density of crystallographic defects in the layer stack to decrease along the stacking direction. In other words, the crystalline quality of the layer stack increases along the stacking direction.

According to at least one embodiment of the layer structure, the layer stack is free from a mask layer that comprises silicon. In particular, the layer stack is free from a silicon dopant. This means that—with the exception of the carrier having the silicon surface—only undesired silicon impurities caused by the production tolerances are present in the layer structure. Accordingly, the term "free from silicon" is to be understood within the limits of the production impurities that can be introduced into the semiconductor layer during the growth of semiconductor layers.

According to at least one embodiment of the layer structure, the GaN layer comprises a 3D GaN layer and a 2D GaN layer. The decrease in dislocation density takes place here in a transitional region between the 3D GaN layer and the 2D GaN layer. The reduction in dislocation density takes place within a small region within the GaN layer along the stacking direction of the layer stack. This rapid reduction in dislocation density is a result of the transition from the 3D GaN layer to the 2D GaN layer.

According to at least one embodiment of the layer structure, dislocation lines in the transitional region between the 3D GaN layer and the 2D GaN layer run transverse to the stacking direction in places. For example, in the region of the first layer sequence, dislocation lines run substantially along the stacking direction. In the region of the 3D GaN layer, said dislocation lines turn towards the side. In other words, the dislocations increasingly run obliquely to the stacking direction. This allows the dislocation lines to coalesce, thus enabling the dislocation to be annihilated. This annihilation can be detected e.g. with a transmission electron microscope. In the region of the 3D GaN layer, therefore, dislocation lines run transverse to the stacking direction, at least in places.

According to at least one embodiment of the layer structure, the dislocation density decreases within a region of which the height corresponds to no more than ⅕ of the total height of the first layer sequence, the 3D GaN layer and the 2D GaN layer in the stacking direction, to a value of at most $2\times10^9$ cm$^{-3}$. The dislocation density therefore decreases in a small region of the layer stack in particular. For example, the height of the 3D GaN layer is at least 200 nm and at most 300 nm. The overall height of the first layer sequence can be at least 1600 nm and at most 1800 nm, for example.

According to at least one embodiment of the layer structure, the first layer sequence contains the gradient layer, which comprises $Al_xGa_yN$, wherein the aluminum fraction x of the gradient layer decreases along the stacking direction and wherein the gallium fraction y of the gradient layer increases along the stacking direction. The aluminum fraction in the gradient layer therefore reduces with increasing distance from the silicon surface of the carrier.

According to at least one embodiment of the layer structure, the layer stack comprises a second layer sequence, which follows the GaN layer in the stacking direction. In this case, the height of the second layer sequence in the stacking direction is at least half the height of the layer stack in the stacking direction. For example, the height of the layer stack can be at least 5 and at most 6 μm, while the height of the second layer sequence is at least 4 and at most 5 μm. The second layer sequence thus forms a large part of the layer structure.

The second layer sequence contains aluminum, gallium and nitrogen. The second layer sequence can also contain indium. In particular, it is possible for the second layer sequence to have a relaxed layer and a pseudomorphic layer, the relaxed layer containing more aluminum than the pseudomorphic layer. In particular, it is possible for the pseudomorphic layer to contain no aluminum, within the limits of production tolerances. The relaxed layer is preferably located closer to the silicon surface along the stacking direction than the pseudomorphic layer. The relaxed layer is therefore arranged after the pseudomorphic layer in the stacking direction.

The relaxed layer preferably exhibits cracks. In other words, the relaxed layer contains areas where the relaxed layer is divided. At least one sectional plane through the relaxed layer along the main extension plane is therefore not simply connected. In these areas, for example, the pseudomorphic layer can penetrate into the relaxed layer. It is also possible for the cracks in the relaxed layer to be voids in the layer structure. The voids can for example be filled with a gas such as air. The cracks are caused in particular by the relaxed growth of the layer.

According to at least one embodiment of the layer structure, the GaN layer has a higher volume concentration of carbon impurities in the regions of the 3D GaN layer than in the regions of the 2D GaN layer. The higher volume concentration of carbon impurities is caused in particular by the specially selected growth conditions of the 3D GaN layer. For instance, a very low V/III ratio is provided for the growth of the 3D GaN layer. One of the consequences of this is that a high carbon fraction is incorporated into the layer.

According to at least one embodiment of the layer structure, the layer structure exhibits a convex curvature in the stacking direction after a cooling operation. The curvature can in particular be very low.

The method and layer structure described here are explained in more detail below with the aid of exemplary embodiments and the accompanying figures.

FIGS. 1 and 2 show exemplary embodiments of a method and layer structure as described here with the aid of schematic sectional views.

Figure 2A:
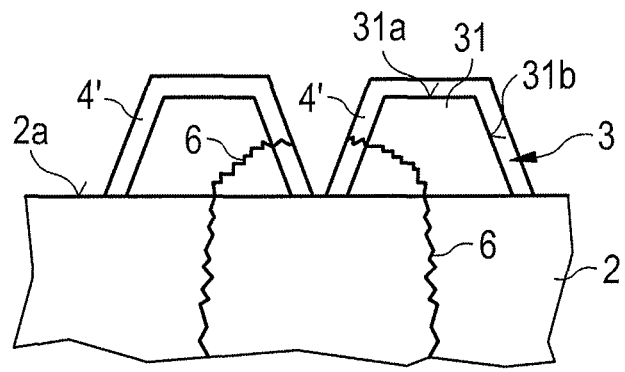

Identical, similar or equivalent elements are provided with the same reference numerals in the figures. The figures and the size ratios of the components illustrated in the figures are not to be regarded as to scale. Instead, individual components may be illustrated with exaggerated size in order to illustrate them better and/or to aid understanding.

With the aid of the schematic sectional view of FIG. 1A, a first process step of a method for producing a layer structure 10 as described here is explained in more detail. In the method, a carrier 1 with a silicon surface 1a is first prepared. The carrier acts as a growth substrate for the subsequent layers.

On the silicon surface 1a of the carrier 1, along a stacking direction H, a first layer sequence 2 is grown, which comprises a seeding layer 21 and a buffer layer 22. In addition, the optional gradient layer 23 is illustrated in FIG. 1A. The first layer sequence 2 here can comprise aluminum, oxygen, nitrogen and gallium. For example, the aluminum fraction in the seeding layer 21 can be higher than in the gradient layer 23. In particular, the aluminum fraction can be higher in the regions of the first layer sequence 2 that are closer to the silicon surface 1a than in the regions that are further away from the silicon surface 1a in the stacking direction H. It is also possible for the buffer layer 22 to be formed from the same material as the seeding layer 21.

On a top surface 2a of the first layer sequence 2, the top surface 2a facing away from the silicon surface 1a, a 3D GaN layer 3 is now grown three-dimensionally. The three-dimensional growth of the 3D GaN layer 3 results in the formation of islands 31, which have a height in the stacking direction H. Incomplete coverage of the top surface 2a of the first layer sequence 2 with the plurality of multi-layer islands 31 is obtained here. It is possible here for a few islands 31 to partially overlap laterally.

FIG. 1B shows a further process step of a method for producing a layer structure 10. On the outer surfaces 3a of the 3D GaN layer 3, the outer surfaces 3a facing away from the silicon surface 1a, a 2D GaN layer 4, which likewise contains gallium nitride, is now grown two-dimensionally. The 2D GaN layer 4 fills in the regions between the islands 31 here. The 3D GaN layer 3 is thus coalesced by means of the 2D GaN layer. The 2D GaN layer 4 therefore preferably grows initially in the regions between the islands 31 of the 3D GaN layer 3. As soon as the 2D GaN layer 4 projects above the height of the islands 31 of the 3D GaN layer 3, the 2D GaN layer 4 also coalesces two-dimensionally. This results in the formation of a continuous GaN layer 3, 4.

On the top surface 4a of the 2D GaN layer 4, a second layer sequence 5 is grown. The second layer sequence 5 contains a relaxed layer 51 and a pseudomorphic layer 52. The relaxed layer 51 here can have a higher aluminum fraction than the pseudomorphic layer 52. However, it is also possible—differing from what is shown in the figures—that no second layer sequence 5 is grown.

After the growth of the second layer sequence 5, therefore, the layer stack 11 of the layer structure 10 is created. The layer stack 11 contains the first layer sequence 2, the 3D GaN layer 3, the 2D GaN layer 4 and the second layer sequence 5. The 3D GaN layer 3 and the 2D GaN layer 4 can in particular consist of the same material. After the growth, the 3D GaN layer 3 and the 2D GaN layer 4 together thus form the GaN layer 3, 4. In the region of the 3D GaN layer 3, the layer stack 11 can have a higher dislocation density and/or a higher fraction of carbon impurities. This makes it possible to differentiate between the 3D GaN layer 3 and the 2D GaN layer 4 even in the finished object.

Figure 2B:
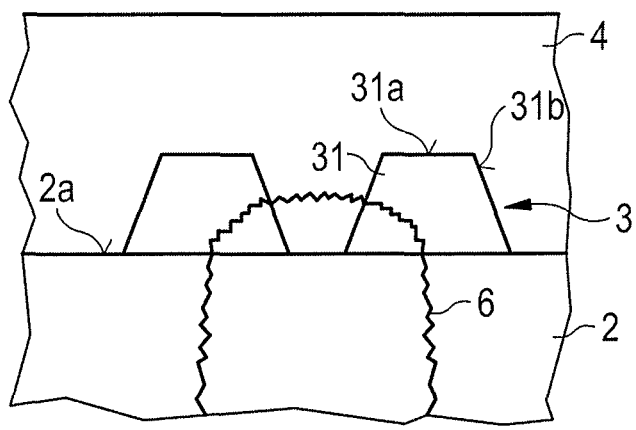

According to FIGS. 2A and 2B, a further exemplary embodiment of a layer structure as described here is explained in more detail. FIGS. 2A and 2B both show an enlarged view of two islands 31 of the 3D GaN layer 3 of a layer structure 10. In FIG. 2A, the growth of the 2D GaN layer 4' has started, with the coalescence of the islands 31 not yet being fully completed. The 2D GaN layer 4' preferably first covers the lateral surfaces 31b of the multi-layer islands 31. Accordingly, the top surface 2a of the first layer sequence 2 is not yet fully covered. The top surfaces 31a of the multi-layer islands 31 can be at least partially covered by the 2D GaN layer 4' at the stage of the process shown in FIG. 2A.

From the first layer sequence 2, a dislocation 6 extends substantially along the stacking direction H in the direction of the top surface 2a of the first layer sequence 2. In the region of the islands of the 3D GaN layer 3, the growth of the dislocation occurs obliquely to the top surface 2a of the first layer sequence 2. The oblique course of the dislocations 6 can originate e.g. from a change in the orientation of the crystal planes within the 3D GaN layer. On the one hand, therefore, the turning of the dislocations 6 may be associated with the change in the preferred direction of growth in the crystal. On the other hand, it is possible that the dislocation 6 tends towards the open lateral surface 31b of the respective island 31 if the dislocation 6 is not too far away from the lateral surface 31b.

During coalescence, two dislocations 6 that have previously turned or are running obliquely meet. This enables two dislocations 6 to annihilate one another in the space between the islands 31 of the 3D GaN layer 3. Such an annihilation of the dislocations 6 can be detected in the finished layer structure 10.

Figure 2C:
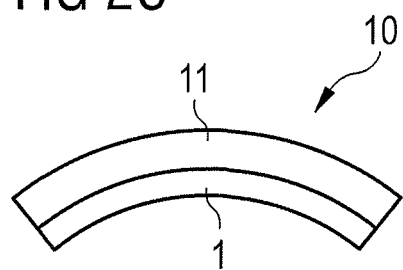
Figure 2D:
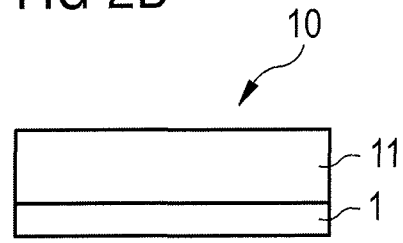

According to the schematic sectional view of FIG. 2C, a further exemplary embodiment of a layer structure 10 as described here is explained in more detail. FIG. 2C shows a layer structure 10 before the cooling of the layer structure 10. The layer structure 10 exhibits a convex curvature before cooling. FIG. 2D shows a layer structure 10 after cooling. The layer structure 10 no longer exhibits a convex curvature here and is substantially planar or exhibits only a slight convex or concave curvature. The reduction of the convex curvature by cooling the layer structure 10 is attributable to the different coefficients of thermal expansion of the layers of the layer structure 10. In particular, the coefficient of thermal expansion of the material of the carrier 1 is lower than the coefficient of thermal expansion of the material of the layer stack 11.

Figure 3A:
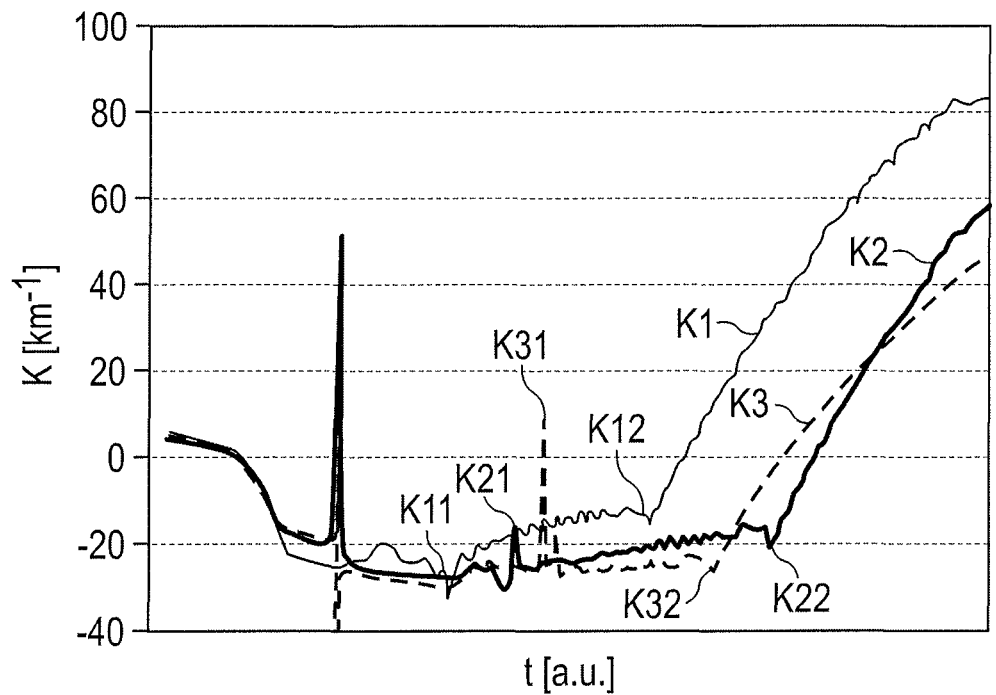
FIG. 3 shows curvature measurements and full widths at half maximum from X-ray diffraction measurements of a layer structure as described here.

According to the exemplary curvature measurement of FIG. 3A, a further exemplary embodiment of a method as described here for producing a layer structure 10 is explained in more detail. FIG. 3A shows a first measured curve K1, a second measured curve K2 and a third measured curve K3, each of which shows the curvature K of a layer structure as a function of the process time t. The process time is given here in arbitrary units (a.u.). The carrier 1 is first heated for about 2000 s. The process then starts at a time of about 2000 s. The measured curves K1, K2 and K3 are only plotted up to a process time of 10000 s. At this point, the layer structure 10 is already completed. Then, from a point >10000 s, the layer structure 10 is cooled.

The first measured curve K1 shows the curvature of a layer structure 10, which was produced using a method as described here, wherein the seeding layer 21 is applied by PVD. The second measured curve K2 shows the curvature of a layer structure 10, which was also produced using a method as described here, wherein the seeding layer 21 is applied by MOCVD. The third measured curve K3 shows the curvature of a layer structure of otherwise identical construction, which comprises a silicon nitride mask layer instead of a 3D GaN layer 3, wherein the seeding layer 21 of the layer structure is applied by MOVPE. Accordingly, the measured curves K2 and K3 can be compared with one another directly.

The high peak of the third measured curve K3 at a time of about 2200 s is a measurement artefact. The first, second and third starting points K11, K21 and K31 each mark the point at which the application of the 3D GaN layer 3, or in the case of measured curve K3 the silicon nitride mask layer, is started. The first, second and third intermediate points K12, K22 and K32 each mark the point at which the application of the pseudomorphic layer 52 is started.

The first and second measured curves K1 and K2 exhibit a similar slope during the growth of the second layer sequence 5. The first and second measured curves K1 and K2 additionally exhibit a higher slope than the third measured curve K3. In other words, the curvature of the first and second measured curves K1 and K2 increases more rapidly than the curvature of the third measured curve K3. The slope of the curvature corresponds substantially to the stress of the layer structure 10. A positive slope here may be considered equivalent to a change in the curvature to a convex curvature of compressive stress. The greater the slope in a curvature curve, the greater can be the degree to which the natural lattice constant of the underlying layer is adopted in the case of the second layer sequence. In other words, where there is a higher slope in the curvature measurement, the fraction of the natural lattice constants of the layer lying below the respective layer with a correspondingly high slope can also be higher.

The layer structures 10 that are produced by a method according to the invention as described here therefore exhibit a higher compressive stress before cooling. In particular, a layer structure 10 comprising a seeding layer 21 which is applied by a PVD method shows a high compressive stress here. This can counteract a tensile stress after cooling.

Figure 3B:
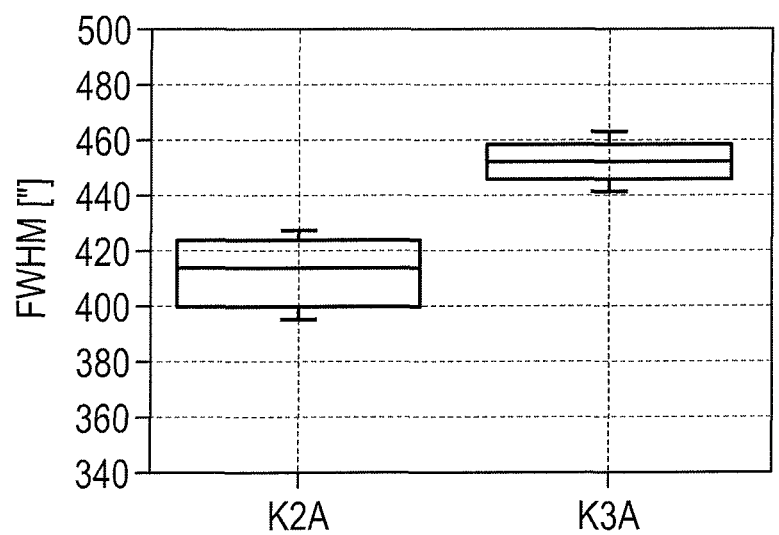

According to the full widths at half maximum (FWHM) of FIG. 3B, a further exemplary embodiment of a layer structure 10 as described here is explained in more detail. The full widths at half maximum are obtained from X-ray diffraction measurements. FIG. 3B shows a first full width at half maximum K2A and a second full width at half maximum K3A of the angular distributions measured by X-ray diffraction. A higher crystalline quality here leads to a narrower angular distribution and thus to a lower full width at half maximum. In particular, a reduced number of defects and dislocations in the crystal lattice of the layer structure would lead to a reduction in the scattering of an X-ray and thus to a reduction in the full width at half maximum of the X-ray diffraction measurement. The full widths at half maximum K2A and K3A are each given in angular seconds.

The first full width at half maximum K2A was measured with a layer structure 10 that was produced by a method as described here. The second full width at half maximum K3A was measured with a layer structure of otherwise identical construction which comprises a mask layer with silicon nitride. The first full width at half maximum K2A is lower than the second full width at half maximum K3A. A layer structure 10 as described here accordingly has fewer defects than a layer structure of otherwise identical construction which contains a mask layer with silicon nitride.

The method for producing a layer structure 10 as described here or the layer structure 10 as described here has a number of advantages. For instance, the layer structure 10 is free from a mask layer with silicon. For the construction of electronic components in particular, such a silicon layer in the layer stack 11, particularly in the GaN layer 3, 4, could lead to undesirable transverse conductivity on the n side on the layer structure of the semiconductor component. Furthermore, the compressive stress of the layers already occurs at a very early stage in the process. This leads in particular to better stress values, which means that cracks in the layer structure, which do not penetrate the electrical and optoelectronic layers but destroy the surface layers, can be avoided.

In particular, the crystalline quality of the layer structure as described here is at least as good as the crystalline quality of a layer structure of otherwise identical construction which comprises a mask layer with silicon.

The present application claims the priority of the German application DE 10 2014 105 303.6, the disclosure content of which is herein incorporated by reference.

The description with the aid of the exemplary embodiments does not limit the invention thereto. Rather, the invention comprises any new feature and any combination of features, which contains in particular any combination of features in the claims even if this feature or this combination is not itself stated explicitly in the claims or exemplary embodiments.

The invention claimed is:

1. A method for producing a layer structure as a buffer layer of a semiconductor component having the following steps:
   a) providing a carrier, which has a silicon surface;
   b) deposition of a first layer sequence, which comprises a seeding layer containing aluminum, oxygen and nitrogen, on the silicon surface of the carrier along a stacking direction running perpendicular to a main extension plane of the carrier;
   c) three-dimensional growth of a 3D GaN layer, which is formed with gallium nitride, on a top surface of the first layer sequence, the top surface facing away from the silicon surface; and
   d) two-dimensional growth of a 2D GaN layer, which is formed with gallium nitride, on the outer surfaces of the 3D GaN layer, the outer surfaces facing away from the silicon surface,
   wherein the 3D GaN layer and the 2D GaN layer consist of the same material.

2. The method according to claim 1, wherein in step c) the 3D GaN layer has a plurality of multi-layer islands, which extend along the stacking direction, and an incomplete coverage of the top surface of the first layer sequence with the plurality of multi-layer islands results, and
   wherein in step d) the plurality of multi-layer islands coalesces by means of the 2D GaN layer, wherein the 2D GaN layer borders lateral surfaces of the multi-layer islands in places, which lateral surfaces run obliquely to the top surface of the first layer sequence, resulting in a complete coverage of the top surface of the first layer sequence.

3. The method according to claim 1, wherein during the three-dimensional growth in step c) compared with the two-dimensional growth in step d) at least one of the growth conditions is changed as follows:
   reduction of the reactor temperature,
   increase of the reactor pressure and/or
   reduction of the V/III ratio.

4. The method according to claim 1, wherein the deposition of the first layer sequence in step b) includes the following steps:
   growth of the seeding layer onto the silicon surface of the carrier; and
   growth of a buffer layer comprising aluminum and nitrogen on a side of the seeding layer facing away from the silicon surface.

5. The method according to claim 1, wherein the deposition of the first layer sequence in step b) additionally includes the following step:
   growth of a gradient layer, which is formed with $Al_xGa_yN$, on a side of the buffer layer facing away from the silicon surface, wherein the concentration fraction of the aluminum atoms x decreases along the stacking direction and wherein the concentration fraction of the gallium atoms y increases along the stacking direction.

6. The method according to claim 1, wherein following the growth of the 2D GaN layer in step d) a second layer sequence is grown on a side of the 2D GaN layer facing away from the silicon surface,
   wherein the second layer sequence contains aluminum, gallium and nitrogen, and comprises a relaxed layer and a pseudomorphic layer,
   wherein the relaxed layer has a higher aluminum fraction than the pseudomorphic layer,
   wherein the growth of the relaxed layer is carried out before the growth of the pseudomorphic layer, and
   wherein the pseudomorphic layer is under compressive stress.

7. The method according to claim 1, wherein the layer structure is cooled at the end of the method, and
   wherein the curvature of the layer structure in the stacking direction is convex before the cooling.

8. The method according to claim 1, wherein the 3D GaN layer and the 2D GaN layer are each under compressive stress before cooling.

9. The method according to claim 1, wherein the introduction of silicon into the layer structure, with the exception of the silicon surface of the carrier, is avoided in a targeted manner.

10. The method according to claim 1, wherein the seeding layer is applied by a PVD method.

11. A layer structure as a buffer layer of a semiconductor component, comprising:
   a carrier having a silicon surface; and
   a layer stack, which is arranged on the silicon surface of the carrier in the stacking direction, comprising:
      a first layer sequence having a seeding layer which contains aluminum and nitrogen, and
      a GaN layer,
   wherein the density of the dislocations in the layer stack decreases along the stacking direction,
   wherein the layer stack is free from a mask layer that comprises silicon,
   wherein the first layer sequence and the GaN layer are free from a silicon dopant, and
   wherein the GaN layer comprises a 3D GaN layer and a 2D GaN layer which consist of the same material.

12. The layer structure according to claim 11, wherein reduction in dislocation density takes place in a transitional region between the 3D GaN layer and the 2D GaN layer.

13. The layer structure according to claim 11, wherein in the transitional region between the 3D GaN layer and the 2D GaN layer, dislocation lines run transverse to the stacking direction in places.

14. The layer structure according to claim 11, wherein the dislocation density decreases within a region of which the height corresponds to no more than ⅕ of the total height of the first layer sequence and the GaN layer in the stacking direction, to a value of at most $2\times10^9$ cm$^{-3}$.

15. The layer structure according to claim 11, wherein the first layer sequence contains a gradient layer, which is formed with $Al_xGa_yN$, wherein $0\leq x\leq 1$ and $0\leq y\leq 1$, the concentration fraction of the aluminum atoms x in the gradient layer decreases along the stacking direction and wherein the concentration fraction of the gallium atoms y in the gradient layer increases along the stacking direction.

16. The layer structure according to claim 11, wherein the layer stack comprises a second layer sequence which follows the GaN layer in the stacking direction,
   wherein the height of the second layer sequence in the stacking direction is at least half the height of the layer stack in the stacking direction,
   wherein the second layer sequence contains aluminum, gallium and nitrogen,
   wherein the second layer sequence comprises a relaxed layer and a pseudomorphic layer,
   wherein the relaxed layer has a higher aluminum fraction than the pseudomorphic layer,
   wherein the relaxed layer is arranged before the pseudomorphic layer in the stacking direction, and
   wherein the relaxed layer exhibits cracks.

17. The layer structure according to claim 11, wherein the GaN layer has a higher volume concentration of carbon impurities in the regions of the 3D GaN layer than in the regions of the 2D GaN layer.

18. The layer structure according to claim 11, wherein the layer structure exhibits a convex curvature in the stacking direction before cooling.

19. A method for producing a layer structure as a buffer layer of a semiconductor component having the following steps:
   a) providing a carrier, which has a silicon surface;
   b) deposition of a first layer sequence, which comprises a seeding layer containing aluminum, oxygen and nitrogen, on the silicon surface of the carrier along a stacking direction running perpendicular to a main extension plane of the carrier;
   c) three-dimensional growth of a 3D GaN layer, which is formed with gallium nitride, on a top surface of the first layer sequence, the top surface facing away from the silicon surface; and
   d) two-dimensional growth of a 2D GaN layer, which is formed with gallium nitride, on the outer surfaces of the 3D GaN layer, the outer surfaces facing away from the silicon surface,
   wherein the layer stack which comprises the first layer sequence, the 3D GaN layer and the 2D GaN layer is free from a mask layer that comprises silicon,
   wherein the first layer sequence, the 3D GaN layer and the 2D GaN layer are free from a silicon dopant, and
   wherein the 3D GaN layer and the 2D GaN layer consist of the same material.

* * * * *